(12) United States Patent
Murray

(10) Patent No.: US 9,844,906 B2
(45) Date of Patent: Dec. 19, 2017

(54) RELEASE WEBS AND TEXTURED PRODUCTS

(71) Applicant: S.D. Warren Company, Boston, MA (US)

(72) Inventor: Robert J. Murray, Yarmouth, ME (US)

(73) Assignee: S.D. WARREN COMPANY, Boston, MA (US)

(*) Notice: Subject to any disclaimer, the term of this patent is extended or adjusted under 35 U.S.C. 154(b) by 87 days.

(21) Appl. No.: 14/964,849

(22) Filed: Dec. 10, 2015

(65) Prior Publication Data

US 2017/0165899 A1    Jun. 15, 2017

(51) Int. Cl.
| | |
|---|---|
| *B32B 3/00* | (2006.01) |
| *B29C 59/02* | (2006.01) |
| *B05D 1/30* | (2006.01) |
| *B05D 3/06* | (2006.01) |
| *B29C 33/68* | (2006.01) |
| *B29K 23/00* | (2006.01) |
| *B29K 33/04* | (2006.01) |

(52) U.S. Cl.
CPC .............. *B29C 59/022* (2013.01); *B05D 1/30* (2013.01); *B05D 3/068* (2013.01); *B29C 33/68* (2013.01); *B29C 2059/023* (2013.01); *B29K 2023/12* (2013.01); *B29K 2033/04* (2013.01); *B29K 2883/00* (2013.01); *B29K 2905/08* (2013.01)

(58) Field of Classification Search
CPC . B29C 59/022; B29C 2059/023; B29C 33/58; B05D 3/065; B05D 3/067
See application file for complete search history.

(56) References Cited

U.S. PATENT DOCUMENTS

| | | | |
|---|---|---|---|
| 4,289,821 A | 9/1981 | Gray | |
| 4,322,450 A | 3/1982 | Gray | |
| 6,355,343 B1 | 3/2002 | Glassock | |
| 7,650,848 B2 | 1/2010 | Brennan | |
| 7,964,243 B2 | 6/2011 | Blenkhorn | |
| 8,997,672 B2 | 4/2015 | Brennan | |
| 2010/0215911 A1* | 8/2010 | Shina | B32B 27/10 428/172 |

(Continued)

FOREIGN PATENT DOCUMENTS

| | | |
|---|---|---|
| DE | 10124710 | 11/2002 |
| DE | 102012005312 | 9/2013 |

(Continued)

OTHER PUBLICATIONS

Extended Search Report—Corresponding EP Application No. 16203157, dated Feb. 24, 2017, 7 pages.

(Continued)

*Primary Examiner* — Elizabeth E Mulvaney
(74) *Attorney, Agent, or Firm* — Leber IP Law; Celia H. Leber

(57) ABSTRACT

The present disclosure features processes and equipment for manufacturing materials that have a textured surface formed by applying a first texture to a curable coating, curing the coating, and then embossing a second, different texture over the first texture. The disclosure also features textured materials, including both release webs for use in replicative casting processes and finished products in sheet, board, plate or web form.

28 Claims, 7 Drawing Sheets

(56) References Cited

U.S. PATENT DOCUMENTS

2015/0174625 A1   6/2015   Hart et al.

FOREIGN PATENT DOCUMENTS

| EP | 1702752 | 9/2006 |
|----|---------|--------|
| WO | 00/26003 | 5/2000 |
| WO | 01/15820 | 3/2001 |
| WO | 2015106085 | 7/2015 |

OTHER PUBLICATIONS

Invitation to Pay Additional Fees—Corresponding PCT Application No. PCT/US2016/064929, dated Mar. 17, 2017, 7 pages.

\* cited by examiner

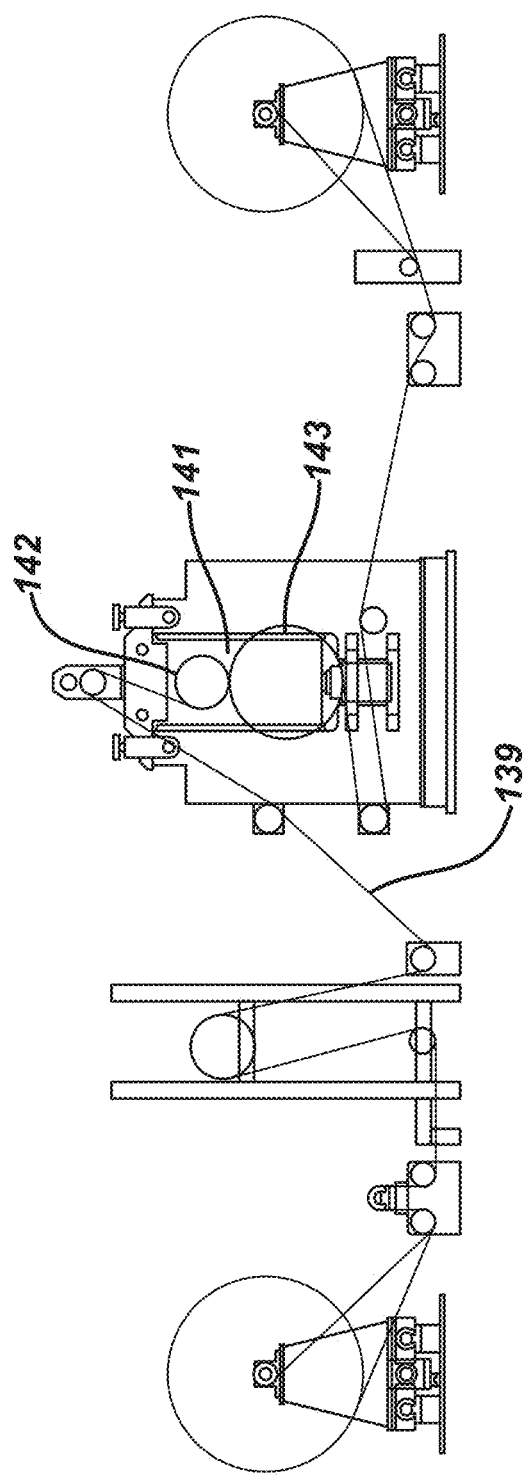

RELEASE WEBS AND TEXTURED PRODUCTS

BACKGROUND

Surface textures, e.g., three-dimensional patterns, may be imparted to web materials by a process in which a web is coated with a curable coating, a texture is imparted to the curable coating by a replicative surface, e.g., an engraved metal roll, and the coating is cured while in contact with the roll by passing radiation through the web.

The web materials resulting from this process may be used as release webs in processes in which a plastic film is formed (e.g., cast) on or against a release web, and then separated from the release web after cooling or curing to set the plastic material. The release web provides a surface from which the set plastic material can be readily separated and imparts to the surface of the plastic material the texture of the release surface. For example, a desired textured surface can be provided on the surface of a plastic sheet material by forming the plastic material on or against a release web having a textured surface that is the mirror image of the desired textured surface.

U.S. Pat. Nos. 4,289,821 and 4,322,450, the disclosures of which are incorporated herein by reference, disclose techniques for producing surface effects in a release coating on a release web for use in casting processes. One method disclosed comprises applying a coating of an electron beam radiation curable material to one surface of a web substrate, pressing the coated side of the substrate against a replicative surface, e.g., an engraved metal roll, irradiating the coating with electron beam radiation to cure the coating, and stripping the substrate from the replicative surface with the cured coating adhered to the substrate. Using these methods the replicative surface can be reproduced in the cured coating with essentially 100% fidelity. Other replicative casting processes are disclosed in U.S. Pat. Nos. 6,355,343 and 7,964,243, the disclosures of which are incorporated by reference herein.

Replicative casting processes can be used to form very fine, even nanoscale, textures. One example of a micro-scale texture is referred to in the art as "Sharklet." Sharklet textures can be applied to plastic sheet products to provide the products with a surface that is structured to impede bacterial growth. The micro-scale texture of the surface replicates sharkskin denticles, which are arranged in a diamond pattern with millions of tiny ribs. Sharklet materials are discussed, for example, in U.S. Pat. Nos. 7,650,848 and 8,997,672, the complete disclosures of which are incorporated herein by reference. Such materials are important in providing non-toxic bioadhesion control and antifouling properties, and have been proposed for use in the medical device industries. Other micro-scale textures include lenticular lens textures, drag reduction textures (e.g., Riblet features), and cube corner textures that create a reflective surface.

Nano-scale textures include diffraction gratings, hydrophobic surfaces (e.g., lotus leaf like surfaces having a micro- and nanoscopic architecture on the surface that minimizes the adhesion of a droplet adhesion to the surface), and laser interference rainbow patterns, which display reflected light as colors of the visual spectrum. One example of a nanoscale texture is a diffraction grating that has a series of raised ridges about 400 nm wide, spaced approximately 800 nanometers apart, with a depth of approximately 100 nm.

SUMMARY

The present disclosure features processes and equipment for manufacturing materials that have a textured surface formed by applying a first texture to a curable coating, curing the coating, and then embossing a second, different texture over the first texture. The disclosure also features textured materials, including both release webs for use in replicative casting processes and finished products in sheet, board, plate or web form.

In some implementations, the processes disclosed herein can be used to impart a macro-scale (and thus visible) texture to a micro- or nanoscale textured material such as a Sharklet material. Doing so can enhance the aesthetic qualities of the material, as well as providing other advantages such as improved abrasion resistance and tactile properties.

In one aspect, the present disclosure features a release web for use in replicative casting of curable systems. The release web includes a substrate, and a coating layer disposed on at least one surface of the substrate, the coating layer including a surface effect to be replicated during casting. The surface effect comprises a first, micro- or nanoscale three-dimensional texture and a second, macro-scale three-dimensional texture.

In some implementations, the release web may include one or more of the following features.

The second three-dimensional texture may be post-embossed over the first three-dimensional texture during manufacture of the release web. The first texture may be selected from the group consisting of diffraction gratings, hydrophobic surface textures, laser interference rainbow patterns, and combinations thereof, or from the group consisting of lenticular lens textures, drag reduction textures, cube corner textures, and combinations thereof. In some cases, the second texture has a feature depth of about 50 to 300 microns. The first texture may have a feature length of about 1 to 100 microns a feature width of about 1 to 10 microns, a feature spacing of about 1 to 10 microns, and a feature depth or height of about 1 to 10 microns.

In another aspect, the disclosure features a method that includes applying a coating to a flexible substrate, and imparting a first three-dimensional micro- or nanoscale texture and a second three-dimensional macro-scale texture to the coating to form a release web having a textured surface.

In some implementations, the method may include one or more of the following features.

The method may further include curing the coating after imparting the first texture and before imparting the second texture. Imparting the second three-dimensional texture may comprise embossing the cured coating. At least one of the textures may be applied by nipping the coating against the surface of an engraved roll. For example, embossing the cured coating may be performed by nipping the cured coating against a heated replicative surface. The replicative surface may in some cases be heated to a temperature greater than the glass transition temperature of the cured coating.

The method may further include casting a polymeric film on the release web, and in some cases laminating a sheet form material, e.g., a fabric, board, paper or foil, to the cast polymeric film. The polymeric film may comprise a polyurethane resin.

In another aspect, the disclosure features a product that includes a flexible web having a surface that includes a texture having micro- or nanoscale features and macro-scale features, the micro- or nanoscale features and macro-scale features being disposed on the same area of the web.

In some implementations, the product may include one or more of the following features.

The flexible web may comprise a textured polymeric layer, e.g., of a polyurethane, a thermoplastic such as polypropylene, or a silicone. The product may comprise a silicone mold. In some cases, the flexible web further comprises a sheet form material, e.g., a fabric, board, paper or foil, laminated to the textured polymeric layer.

In another aspect, the disclosure features a method of making a product having a textured surface, the method comprising mechanically embossing a macro-scale three-dimensional texture on a web having a surface provided with a micro- or nanoscale three-dimensional texture.

The disclosure also features a method comprising (a) casting a silicone resin on a textured release web having a macro-scale texture and a micro- or nanoscale texture disposed on the same surface of the web, forming a textured silicone replicative web; (b) forming a mold comprising the textured silicone replicative web; (c) utilizing the mold to create a nickel sleeve; and (d) utilizing the nickel sleeve as a replicative surface to impart the macro-scale texture and micro- or nanoscale texture to a second release web.

As used herein, the terms "texture" and "textured surface" include very fine textures, e.g., including textures having a topography below the wavelength of light. The textures discussed herein are predetermined textures, i.e., textures that are intentionally imparted to a surface rather than merely the texture that is inherently present on any surface due to the natural topography of the surface, surface contamination, and the like.

The phrase "feature spacing distance," as used herein, refers to the distance between adjacent features of a three-dimensional texture. Feature spacing distances may be observed and measured using a confocal microscope or scanning electron microscope (SEM.)

The term "nanoscale," as used herein, refers to features having a feature size of less than 1000 nanometers.

The term "micro-scale," as used herein, refers to features having a feature size of less than 50 µm.

The term "macro-scale," as used herein, refers to features that are discernable with the naked eye.

"Web," as used here in its singular and plural forms, includes both continuous webs and discrete sheets.

All percentages are by weight unless otherwise specified.

Other features and advantages of the invention will be apparent from the following detailed description, the drawings, and the claims.

DESCRIPTION OF THE DRAWINGS

FIG. 2A is a diagrammatic view of the process of FIG. 2.

DETAILED DESCRIPTION

Figure 1:
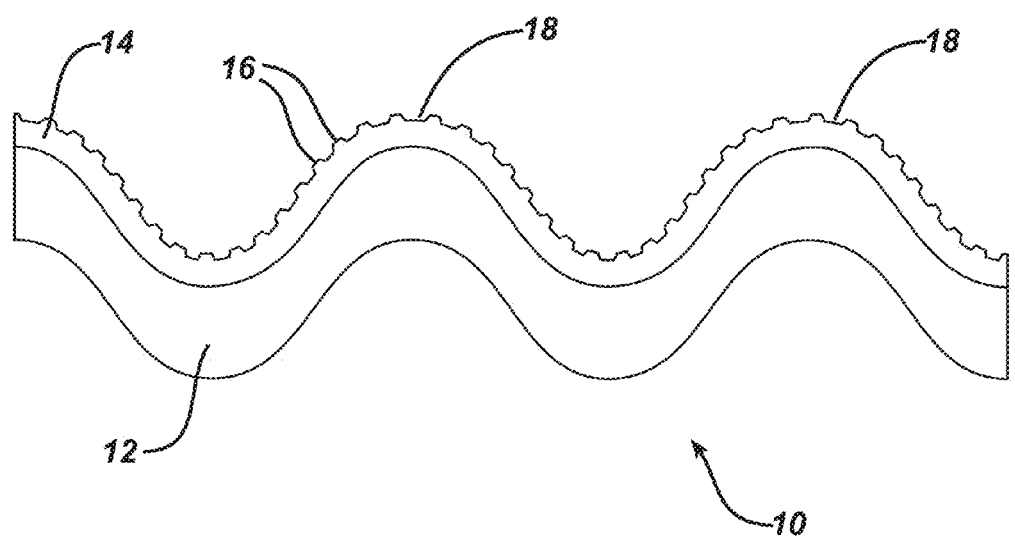
FIG. 1 is a diagrammatic side cross section illustrating a portion of a release web according to one implementation.
Figure 1A:
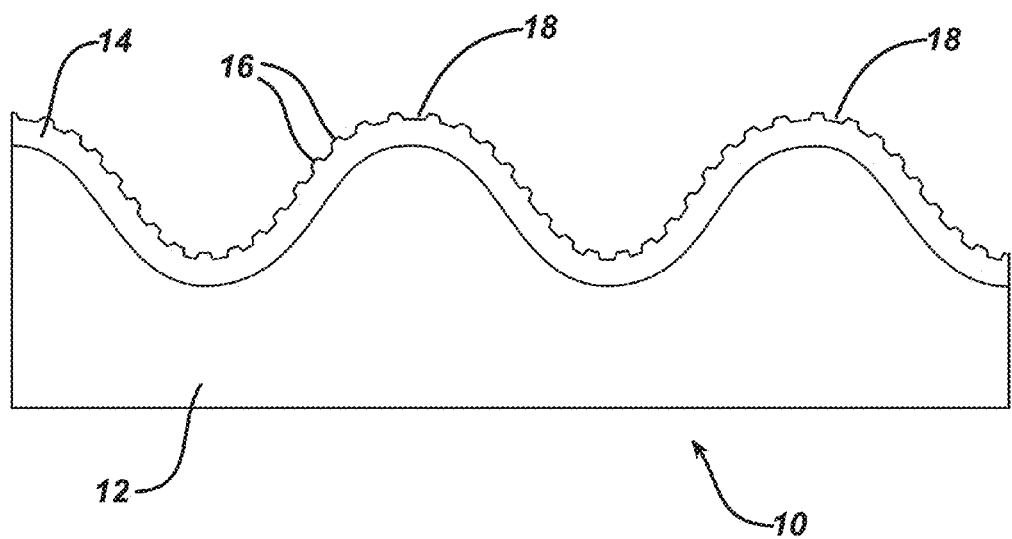
FIG. 1A is a diagrammatic side cross section illustrating a portion of a release web according to an alternate implementation.

The processes described herein involve post-embossing a texture over an underlying finer scale texture. In some cases, the features of the underlying texture are invisible to the naked eye, while the features of the post-embossed texture can be seen with the naked eye. Examples of such an arrangement are shown diagrammatically in FIGS. 1 and 1A, in which a release web 10 includes a substrate 12 bearing a coating 14. The coating 14 includes micro-scale features 16, and macro-scale features 18. The substrate 12 may be deformed by the embossing process that imparts the macro-scale features 18, as shown in FIG. 1, or the macro-scale features 18 may only affect the surface of the substrate, as shown in FIG. 1A. While the features are uniformly spaced in FIGS. 1 and 1A, other textures may be employed in which the micro-scale and/or nanoscale features are irregularly spaced.

In some implementations, the underlying texture is a micro- or nanoscale texture, e.g., a functional texture such as a Sharklet texture, and the post-embossed texture is a larger scale, e.g., macro-scale, texture. As will be discussed below, the processes can be used to form a release web having the two superimposed textures, or can be used to post-emboss a textured product—e.g., a paper or plastic web having a textured surface. For example, the textured product may be a printed décor paper having a Sharklet micro-scale pattern post-embossed with a macro-scale "wood tick" pattern that is glued to a substrate.

The macro-scale texture may be used to provide a micro- or nanoscale textured product, which may otherwise be visually unappealing, with a desired aesthetic appearance. For example, the macro-scale texture may be leather or wood grain, or other visually appealing textures.

The addition of the macro-scale texture also tends to hide seams in the micro- or nanoscale texture, which may result from the process used to create the replicative surface used to obtain the micro- or nanoscale texture. For example, the master micro- or nanoscale pattern may be created on a flat master shim, and the pattern on the shim transferred to a drum for use as the replicative surface. The limited size flat pattern from the master shim is arranged on the surface to give a relatively continuous pattern around the circumference and length of the drum. In this tiling process a visible seam is formed between each patterned area. These seams tend to be aesthetically objectionable, and thus it is advantageous that post embossing tends to minimize the visibility of the seams.

The macro-scale pattern may also reduce the visual strength of the iridescent appearance of a finished product made using the release web in the case of textures, such as Sharklet, that may appear to exhibit iridescence due to the diffraction grating used in such textures.

Surprisingly, the post-embossing process does not deleteriously affect the fidelity of the micro- or nanoscale texture, and thus generally does not negatively impact the functional properties provided by the micro- or nanoscale texture. For example, if the underlying texture is structured to impede bacterial growth, this property will be maintained in the post-embossed product.

The macro-scale texture may also improve the durability and abrasion resistance of the finished product, and protect the underlying micro- or nanoscale texture, by allowing preferential wear of the raised areas of the macro-scale texture.

Textured Webs

Examples of micro-scale textures include the Sharklet patterns described in U.S. Pat. No. 7,145,709 B2. These patterns are composed of a series of ridges that can be above or below the plane of the substrate coating. Micro-scale feature sizes can be in the 0.5 to 50 micron range. In some implementations, feature lengths can be from about 1 to 50 microns, features widths can be from about 1 to 10 microns, feature spacings can be from about 1 to 10 microns, and feature depth or height (vertical distance from the plane of the substrate) can be from about 1 to 10 microns. In one example the ridges vary in length between 4 and 16 microns, have a width of 2 micron, a spacing of 2 microns and a height/depth of 2 to 3 microns. In another example the ridges vary in length between 20 and 80 microns and have a width of 10 micron, a spacing of 2 microns, and a height/depth of 2 to 3 microns. The angle of the side walls of each feature is less than 85 degrees for both examples. In some implementations, the angle of the side walls is from about 10 to 90 degrees, for example from about 50 to 85 degrees. If the angle of the side walls is greater than about 85 degrees the release force of the cured coating from the replicative surface (e.g., engraved roll) can be very high.

Nanoscale textures can have features sizes (length, width and depth/height) in the 10 to 999 nanometer range.

In some implementations, the micro- or nanoscale texture may include features in both the positive and negative z-direction, as is the case, for example, with some Sharklet materials.

The macro-scale texture can be, for example, any of the many textures used on Sappi/Warren Release Papers that are commercially available under the trademark ULTRA-CAST® or tradename Classic, manufactured by S. D. Warren Company d/b/a Sappi North America. An example of a macro pattern is a replicate of a natural leather grain with feature depths of about 50 to 300 microns. Any other desired macro-scale texture may also be used.

The post-embossed texture can include, in addition to macro-scale features, micro-scale features that contribute to the haptic or aesthetic properties (such as surface gloss/brightness) of the texture without being visible to the naked eye.

Processes for Manufacturing Release Webs

Figure 2:
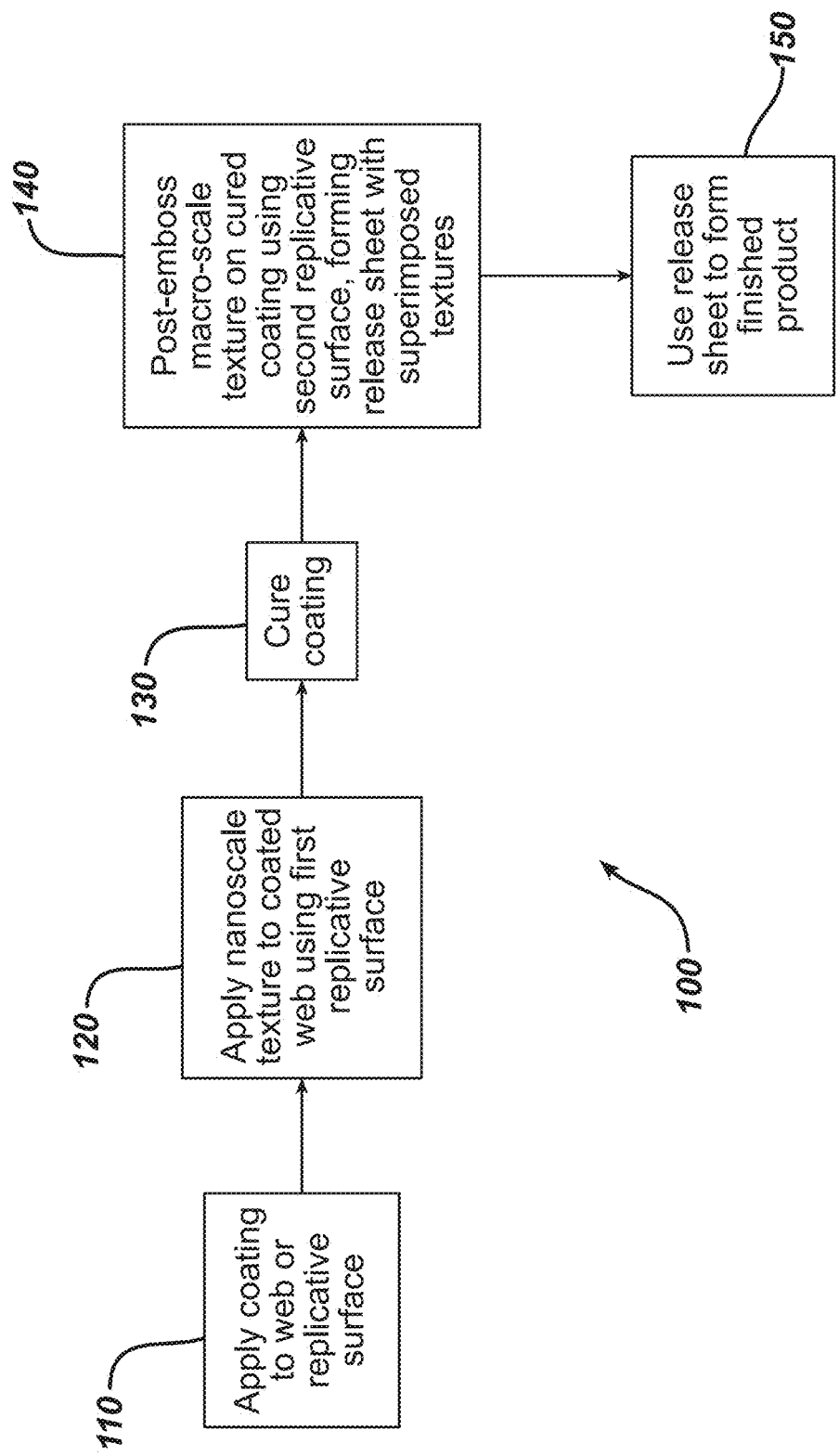
FIG. 2 is a flow diagram of a process for manufacturing a release web according to one implementation.

An example of a process 100 for manufacturing a release web, and a finished product from the release web, is shown in FIGS. 2 and 2A.

Referring to FIG. 2, process 100 includes applying a coating to the surface of either a web substrate that will become the release web, or a replicative surface that will be used to apply a micro- or nanoscale texture to the coating (step 110). For example, the coating can either be applied to the substrate before it reaches the replicative surface, or applied to the replicative surface from which it is transferred to the substrate when the substrate is pressed against the replicative surface.

The substrate web may be any flexible sheetlike substrate, e.g., a paper, metal foils, and plastic films. In some implementations, the substrate web is preferably paper with a base coat to prevent excessive penetration of the coating composition. The replicative surface may be, for example, the surface of an engraved roll, the surface of a textured web that is delivered from a supply roll and wound up on a take up roll, or any other suitable textured surface such as a textured sleeve, belt, cylinder or plate.

The substrate web is nipped against the replicative surface, producing a coated web with a surface having the inverse of the texture of the replicative surface (step 120). The coated web then passes through a curing station to cure the coating, forming a textured web (step 130). The replicative surface remains in contact with the coated web during curing, and the textured web is stripped from the replicative surface after curing. The curing station may include, for example, radiation delivery devices such as UV lamps or electron beam devices. The coating composition is selected to be cured by the devices utilized in the curing station. Generally, no heat or pressure is applied during this step.

The textured web is then post-embossed with a larger scale (e.g., macro-scale) texture using a second replicative surface (step 140.) The post-embossing step, shown in detail in FIG. 2A, may be performed, for example, by passing the web 139 through a nip 141 where the textured surface of the web is pressed against a heated engraved roll (or other replicative surface) 142, e.g., in a hydraulic press. The nip, defined by the engraved roll 142 and a resilient backing roll 143, is pressurized to a desired pressure. The engraved roll may be heated, for example, by steam or oil. Heat and pressure are applied at the nip during this mechanical embossing step to impart the surface texture of the engraved roll to the textured web. Selection of the heat and pressure to be applied in a particular process will be discussed in the Process Parameters section below. The post-embossed web exiting the nip is ready for use as a release web.

After post-embossing, the finished release web can be used to form a desired final product, e.g., by casting a plastic film on the release web (step 150.)

Coating Compositions

Generally, suitable coating compositions are those that, after curing, are capable of being mechanically embossed during the post-embossing process, and capable of withstanding the expected conditions of the subsequent replicative casting process, without sustaining unacceptable damage. The formulation of the coating composition for a particular process will depend on a number of factors, including the depth of the macro-scale pattern to be applied, the post-embossing conditions (e.g., temperature and pressure), and the chemicals that will be employed in the replicative casting process.

Radiation curable acrylate compositions are preferred for many implementations, due to their chemical resistance when cured and their superior flexibility when used as coatings.

In some implementations, the coating composition includes a monofunctional acrylate monomer to impart release properties and flexibility to the cured coating and to act as a diluent, a multifunctional acrylate monomer for crosslinking, and in some cases an acrylated oligomer to provide the cured coating with flexibility.

In some formulations, the ratio between the monofunctional and multifunctional acrylates is from about 15:85 to 85:15. In some implementations, the monofunctional acrylate material provides at least 15%, e.g., at least 25, 35, 45, 55, 65, or 75% of the total acrylate material in the coating composition. In some implementations, from about 15% to about 85%, or about 33% to about 66% of the total acrylate material is monofunctional acrylate monomer. The chain length of the monofunctional acrylate material also affects the release performance of the coating composition. In some implementations, the molecular weight is from about 120 to 380, e.g., from about 128 to about 212, or from about 212 to 324.

Monofunctional monomers include, for example, acrylic acid, N-vinylpyrrolidone, (ethoxyethoxy)ethyl acrylate, and isodecyl acrylate.

Multifunctional monomers include, for example, trimethylolpropane triacrylate (TMPTA), propoxylated glyceryl triacrylate (PGTA), tripropylene glycol diacrylate (TPGDA), and dipropylene glycol diacrylate (DPGDA.) Preferably the multifunctional monomer is selected from the group consisting of TPGDA, TMPTA, and mixtures thereof.

Acrylated oligomers include, for example, acrylated urethanes, epoxies, polyesters, acrylics and silicones. In some implementations, urethane acrylates are preferred. Acrylic oligomers contribute to the mechanical properties of the coating. The inclusion of acrylated oligomers can impart toughness and flexibility to the cured formulation, which may help the cured coating to withstand post-embossing without cracking. Acrylated oligomers are commercially available, for example from Allnex Corporation under the tradename EBECRYL® UV/EB curable resins.

As an example, a composition useful in forming release coatings useful with the methods described herein can include (before curing) 20-50% of an acrylated oligomer, 15-35% of a monofunctional monomer, and 20-50% of a multifunctional monomer.

The composition may include a reactive or non-reactive silicone, e.g., an aminofunctional siloxane, as a release agent to enhance release of the cured coating from the replicative surface if curing is conducted while the coating is in contact with the replicative surface.

The coating composition can include other materials in addition to the acrylic functional material, for example, viscosity control additives, such as colloidal silica or volatile solvents, or surface texture materials, such as starch grains or silica. If UV curing is used, the composition will generally include a photoinitiator. In addition, filler material such as conventional paper coating pigments can be included to reduce costs of the coating. However, the amount of acrylic functional material in the coating composition must be sufficient to provide a continuous, polymerized layer in the areas where it is coated. It is preferable that the acrylic functional material provide at least about 30% by weight of the total coating composition, and more preferable that it provide at least about 40%.

Replicative Surfaces

The replicative surface is generally provided on a rotating cylindrical member, for example a roll or drum having a patterned or engraved sleeve or surface, but may also be provided on a plate, belt or textured release web.

The first replicative surface, used to impart the first, micro- or nanoscale texture, is generally provided on a metal roll or sleeve, and can be formed using photolithography, ion deposition, laser interference, or other techniques that are used to produce surfaces having micro- or nanoscale features. Other types of replicative surfaces may be used, including textured release webs, plates, belts and the like, but generally it is necessary to produce a master using techniques that are capable of forming very fine (micro- or nanoscale) features.

The second replicative surface can be produced using a variety of techniques, as is well known in the embossing art. The second replicative surface should generally be selected to withstand the process parameters used in the post-embossing process.

Process Parameters

The temperature of the web at the nip during the post-embossing step (the embossing temperature ($T_e$)) can be important, in particular to allow accurate, high-fidelity reproduction of the post-embossed texture. One or both of the nip rolls can be heated, e.g., using conventional techniques such as steam and/or hot oil passing or recirculating through the nip roll(s) to heat the web as it passes through the nip. The preferred web temperature for a particular process will depend on various factors, including the formulation of the coating, the thickness of the coating, the dynamics of the nip, the speed of travel of the web through the nip, and the depth of the texture to be post-embossed. The web temperature is sufficiently higher than the glass transition temperature ($T_g$) of the cross-linked coating so that adequate flow of the coating is obtained to allow for accurate embossing. The degree to which the web temperature exceeds the $T_g$ may be determined empirically based on the factors discussed above. In some implementations, the web temperature is from about 100 to 200° F., e.g., from about 140 to 170° F. Higher temperatures, e.g., up to 500° F. or more, may be used depending on the equipment available.

The web temperature is generally lower than the temperature of the heated nip roll(s). In some implementations, the web temperature after exiting the heated nip is about 60 to 100° F. lower than the surface temperature of the heated nip roll(s). This temperature differential may vary depending on various factors affecting heat transfer.

Generally, the web temperature should be sufficiently high so that uniform, high fidelity embossing of the macro-scale pattern is achieved edge-to-edge across the web. A sufficiently high temperature may also help minimize cracking of the coating during post-embossing, if the coating used is susceptible to cracking.

Hard, highly cross-linked coatings with a relatively high $T_g$ (e.g., 120° F.) may be more susceptible to cracking during post-embossing. In some cases, to minimize or avoid cracking it may be desirable to impart more flexibility to the coating, e.g., by changing the coating composition or reducing the coating thickness, and/or to increase the post-embossing temperature.

The pressure applied at the nip is also important to obtaining a good post-embossed texture. If pressure is too high, this may in some cases result in non-uniformity of embossing edge-to-edge across the width of the web. If pressure is too low, the desired feature depth of the embossed texture may not be achieved. In some implementations, the nip pressure is at least 1000 pounds per linear inch (PLI), e.g., from about 1000 to 2000 PLI. Suitable pressures are the same as those that would be used in a standard macro-scale embossing process; it does not appear that the pressure used affects the underlying micro- or nanoscale pattern.

In some cases, the nip includes a resilient backing roll, which may have a durometer of, for example, from about 80 to 90 Shore D.

In some implementations, the coat weight of the coating is from about 10 to 15 g/m². Stiffness of the coating is directly proportional to the coating thickness (stiffness is proportional to the cube of the thickness), and thus lower coat weights generally provide more flexible and thus embossable coatings if other factors are kept constant.

Processes for Post-Embossing Textured Films

Figure 3:
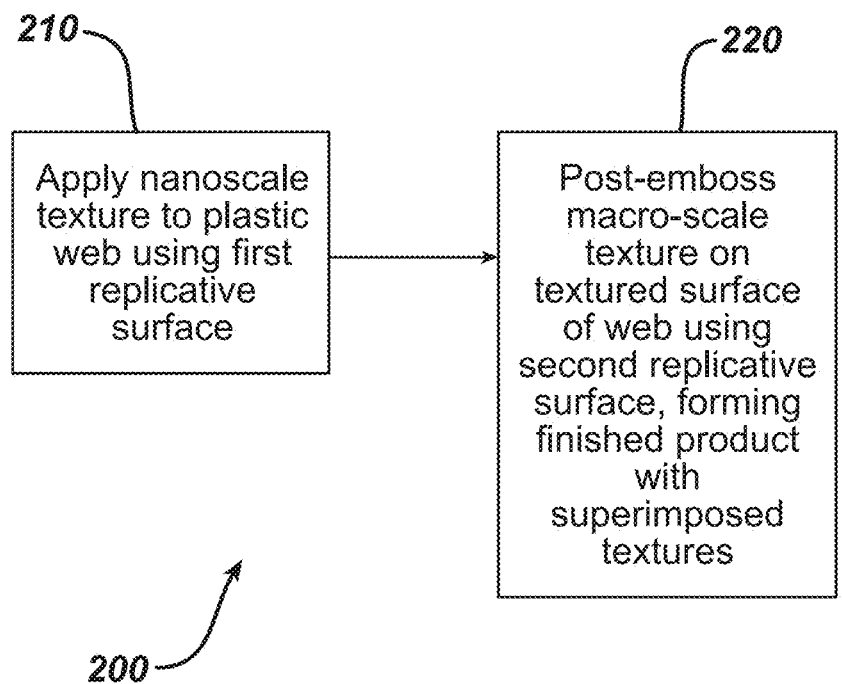
FIG. 3 is a flow diagram of a process for manufacturing a post-embossed web according to one implementation.

In an alternate implementation, shown in FIG. 3, post-embossing is performed on a web that will be an intermediate product or finished product (rather than a release web) once it is post-embossed. Referring to FIG. 3, in process 200 a first texture (e.g., a micro- or nanoscale texture) is applied to a plastic web or a plastic coating applied to a paper web, using a first replicative surface (step 210). The first texture may be applied using any desired technique, for example utilizing a release web carrying the first texture as the first replicative surface, or utilizing any of the techniques discussed above.

The textured web is then post-embossed with a desired texture, e.g., using an engraved roll to provide a second replicative surface (step 220).

The plastic film or coating may be formed, for example, by extrusion or other techniques used to form sheet-like plastic substrates. In some cases, the web comprises a polypropylene sheet material. In other cases, the web comprises a paper web onto which a polypropylene coating is deposited, for example by extruding the polypropylene onto a chill roll textured with the micro- or nanoscale texture while a paper web is nipped in. As another example, a polypropylene film can be extruded or laminated onto a paper web and then the micro- or nanoscale texture can be post-applied to the polypropylene surface.

Thermoplastics other than polypropylene may be used, for example, vinyl, polymethyl methacrylate, and other thermoplastics that are used in embossing processes.

The embossing temperatures for the initial and post-embossing will be selected depending on the softening and melting temperatures of the particular thermoplastic used. The web temperature during post-embossing should generally be sufficiently low so that the micro- or nanoscale pattern is not deleteriously affected and the coating is not melted. This temperature will depend on the melting temperature of the thermoplastic used. For polypropylene, it is generally preferred that the post-embossing temperature be above the softening temperature of polypropylene but less than 200° F.

Embossing pressures will generally be the same as those discussed above in the Process Parameters section.

In some cases, the polypropylene and/or paper can be preprinted with a desired pattern, for example, the paper may be a décor paper.

The post-embossed web may be a finished product, or may be an intermediate—for example the post-embossed web may be subjected to further processing steps such as adhering it to a backing and/or cutting it into sheets.

EXAMPLE 1

Figure 4:
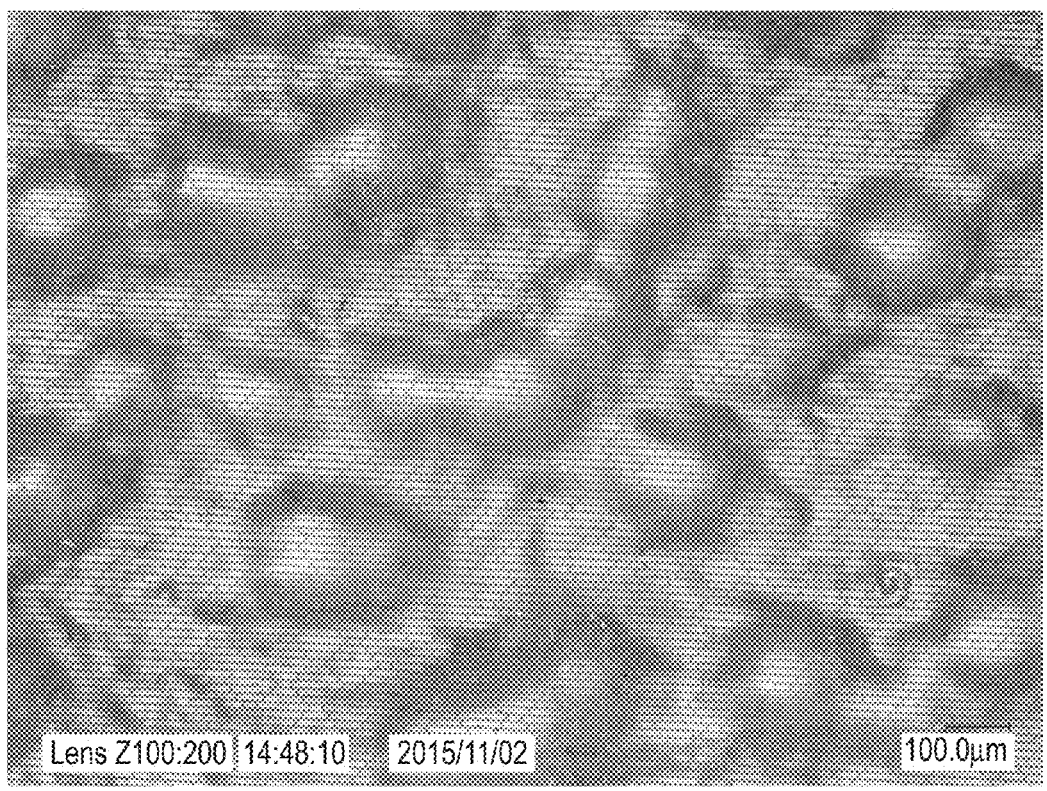
FIGS. 4 and 4A are photomicrographs of a release paper and a urethane fabric made using the release paper, respectively, taken using a confocal microscope. The release paper and fabric include a leather macro-scale pattern superimposed on a Sharklet micro-scale pattern.

The release web shown in FIG. 4 was produced using the following process: A 158 gram/square meter fiber base paper was coated with a clay coating that provided acrylic coating hold out and adhesion. An acrylic coating, the formulation of which is shown below in Table 1, was metered onto the substrate using an offset gravure coating assembly at 18 g/m$^2$, at a coater speed of 60 ft/min. The coated paper was then wrapped around a nickel sleeve with a micro-scale Sharklet pattern and cured with electron beam, using a dose of 4 Mrads. The micro-scale Sharklet pattern had a 2 micron feature spacing, 10 micron width features and a 2.1 micron feature depth.

The micro-scale textured cured paper was wound into a finished roll.

The paper was post embossed in a separate process step as follows:

The web was threaded through tension control rolls and between the embossing roll and resilient backing roll. The engraved embossing roll was preheated to 220° F., and the nip was closed and loaded to a pressure of 1,800 PLI. The paper was run at 60 ft/min to impart the macro texture of the embossing roll to the paper substrate and the micro/macro textured paper release web (shown in FIG. 4) was wound into a roll.

TABLE 1

| Component | Tradename | Weight Percent |
| --- | --- | --- |
| Blend of oligomeric acrylic functional materials | Sartomer Pro 5909 | 29.5 |
| Trimethylopropane triacrylate | Sartomer SR 351 | 7 |
| Isodecyl acrylate | Sartomer SR 395 | 33.5 |

TABLE 1-continued

| Component | Tradename | Weight Percent |
| --- | --- | --- |
| Isocyanurate acrylate oligomer | Sartomer NTX-10014 | 28 |
| Silicone release fluid | Dow 2-8577 Silicone | 2 |

EXAMPLE 2

Figure 4A:
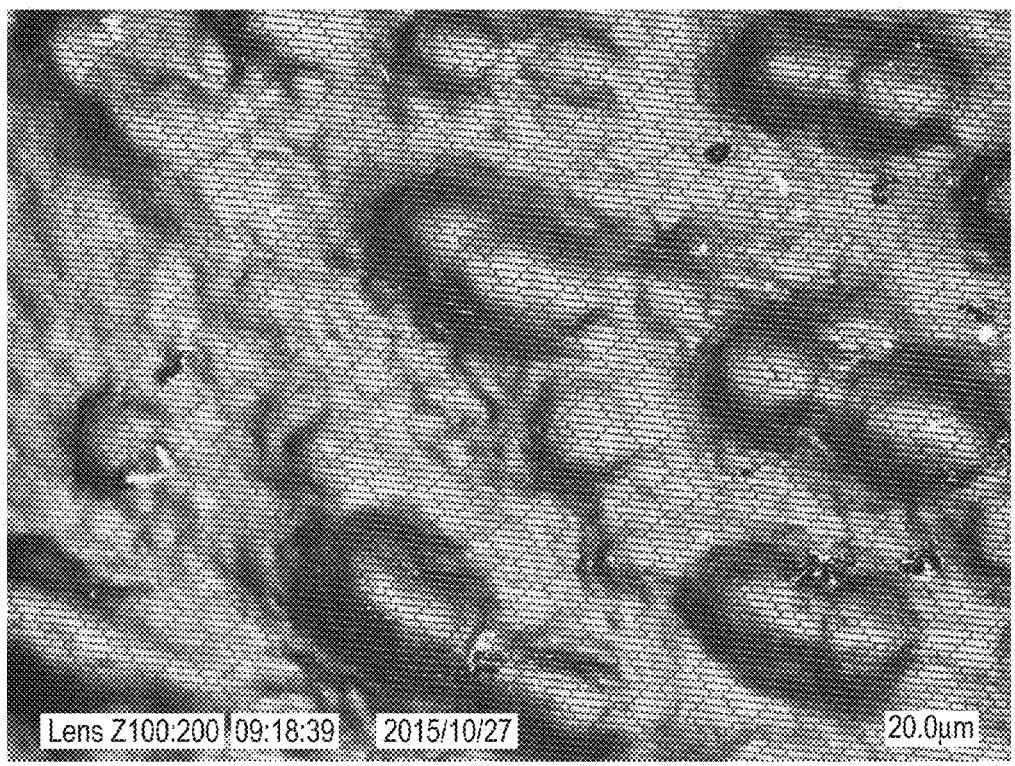

A urethane coated textured fabric, shown in FIG. 4A, was produced using the following process:

A urethane skin coat having a thickness of approximately 75 microns was cast onto the release paper formed in Example 1 and shown in FIG. 4, and heated to 140° C. for two minutes to remove solvents. The coating formulation included, by weight, 80% of a polyurethane resin available from Stahl Holdings under the product designation SU 10-104, 8% DMF (dimethylformamide), and 15% Stahl VP-048-031 pigment.

A urethane adhesive coating was cast (120 micron thick) onto the previously cured cast urethane skin coat layer. The coating formulation was, by weight, 80% IMAPUR 5105 polyurethane resin, 8% DMF (dimethylformamide), and 15% Stahl VP-048-031 pigment.

A nonwoven fabric was then nipped into the wet urethane adhesive coating layer, heated to 140° C. for two minutes and allowed to cool.

The resulting fabric/urethane composite, having a micro/macro surface texture replicating that of the release paper, was stripped from the release paper and is shown in FIG. 4A.

Other Embodiments

A number of embodiments have been described. Nevertheless, it will be understood that various modifications may be made without departing from the spirit and scope of the disclosure.

For example, there are numerous other examples of coatings that can be used in the processes discussed herein. Besides the well-known radical-cured acrylate examples discussed above, other radiation (UV or e-beam) coatings are available. Examples of radiation-cured coatings generally fall into three major groups: "free-radical polymerization," "ionic polymerization," and "donor-acceptor polymerization".

Typical resins cured by radiation-induced free-radical polymerization are (meth)acrylate resins such as discussed above, which are sold by Arkema (Sartomer) Inc. Radical initiated step-growth polymerizations are also possible with thiol-ene systems such as maleic-fumaric unsaturated polyester NOVOC® Performance Resins, supplied by Andara Inc., with thiols such as trimethylolpropane tri(3-mercaptopropionate), THIOCURE® TMPMP, supplied by Evans Chemetics (Bruno Bock), as the curing agent.

A subset of free-radical polymerization is charge-transfer or donor-acceptor polymerization with donors such as vinyl ether and acceptors such as maleate functional resins. An example of this type of formulation includes, as a donor vinyl ether, triethylene glycol divinyl ether DVE-3 from BASF, and maleate-capped unsaturated resins from Piedmont Chemical as an acceptor.

Ionic polymerization usually follows radiation-induced anionic or cationic catalysis. Typical resins cured by base-catalyzed radiation-induced ionic polymerization are epoxy-thiol or Michael addition of thiols to acrylates, but many other base-catalyzed polymerization systems are known. A photobase generator, such as CGI-90 from BASF, upon absorption of radiation produces a strong base that activates the thiol for anionic curing towards Michael reactions or direct anionic curing. The well-known example of an acid-catalyzed ionic polymerization is the cationic polymerization of cycloaliphatic epoxy resins such as Dow's CYRACURE™ UVR-6110 with acid catalysts such as BASF's IRGACURE® 250. Glycidyl epoxies, such as Reichhold's EPOTUF® 31-127, can also be polymerized by acid-catalysis under UV or e-beam radiation with the right choice of catalyst. In each scenario, the proper choice of catalyst precursor and radiation source should be made to develop the radicals or acid/base to initiate polymerization.

For each general example above, various combinations and/or "hybrids" can be made to tailor reaction rates and final mechanical properties. The coating systems above can often be polymerized thermally with an appropriate catalyst albeit typically slower than UV or e-beam cured resins. It is understood to those trained in the art that various ratios of oligomer, diluent, additives such as wetting agents, catalysts, photoinitiators for example, fillers etc. can be utilized to meet specific curing rates and mechanical properties of the coating for the desired fitness-for-use.

The release webs discussed herein can be used to cast textured silicone sheets or webs. Sheets of the textured silicone can then be joined together to form molds that can be used to create nickel sleeves. The resulting nickel sleeve can then be used as a replicative surface to create further release webs, e.g., by embossing a polypropylene coated paper web, carrying the micro- or nanoscale and macro scale texture of the original release web.

Accordingly, other embodiments are within the scope of the following claims.

What is claimed is:

1. A release web for use in replicative casting of curable systems, the release web comprising:
   a substrate; and
   a coating layer disposed on at least one surface of the substrate, the coating layer including a surface effect to be replicated during casting, wherein the surface effect comprises a first, micro- or nanoscale three-dimensional texture and a second, macro-scale three-dimensional texture;
   wherein the second texture is superimposed over the first texture, and the first texture is coextensive with the second texture.

2. The release web of claim 1 wherein the second three-dimensional texture has been post-embossed over the first three-dimensional texture during manufacture of the release web.

3. The release web of claim 1 wherein the first texture is selected from the group consisting of diffraction gratings, hydrophobic surface textures, laser interference rainbow patterns, and combinations thereof.

4. The release web of claim 1 wherein the first texture is selected from the group consisting of lenticular lens textures, drag reduction textures, cube corner textures, and combinations thereof.

5. The release web of claim 1 wherein the second texture has a feature depth of about 50 to 300 microns.

6. The release web of claim 1 wherein the first texture has a feature length of about 1 to 100 microns and a feature width of about 1 to 10 microns.

7. The release web of claim 1 wherein the first texture has a feature spacing of about 1 to 10 microns and a feature depth or height of about 1 to 10 microns.

8. The release web of claim 1 wherein the coating layer comprises an acrylate.

9. The release web of claim 1 wherein the coating layer comprises polypropylene.

10. The release web of claim 1 wherein the substrate comprises paper or plastic.

11. A method comprising:
    applying a coating to a flexible substrate;
    imparting a first three-dimensional micro- or nanoscale texture;
    curing the coating after imparting the first texture; and
    after curing, imparting a second three-dimensional macro-scale texture to the coating to form a release web having a textured surface.

12. The method of claim 11 wherein imparting the second three-dimensional texture comprises embossing the cured coating.

13. The method of claim 11 wherein at least one of the textures is applied by nipping the coating against the surface of an engraved roll.

14. The method of claim 12 wherein embossing is performed by nipping the cured coating against a heated replicative surface.

15. The method of claim 14 wherein the replicative surface is heated to a temperature greater than the glass transition temperature of the cured coating.

16. The method of claim 14 wherein a pressure is applied at the nip of at least 1000 PLI.

17. The method of claim 11 wherein the first texture is selected from the group consisting of diffraction gratings, hydrophobic surface textures, laser interference rainbow patterns, and combinations thereof.

18. The method of claim 11 wherein the first texture is selected from the group consisting of lenticular lens textures, drag reduction textures, cube corner textures, and combinations thereof.

19. A product comprising:
    a flexible web having a surface that includes a texture having micro- or nanoscale features and macro-scale features, the micro- or nanoscale features and macro-scale features being disposed on the same area of the web and being coextensive with each other, with the micro- or nanoscale features underlying the macro-scale features.

20. The product of claim 19 wherein the flexible web comprises a textured polymeric layer.

21. The product of claim 20 wherein the flexible web further comprises a sheet form material laminated to the textured polymeric layer.

22. The product of claim 21 wherein the sheet form material is selected from the group consisting of fabrics, boards, papers and foils.

23. The product of claim 19 wherein the nanoscale texture is selected from the group consisting of diffraction gratings, hydrophobic surface textures, laser interference rainbow patterns, and combinations thereof.

24. The product of claim 19 wherein the micro-scale texture is selected from the group consisting of lenticular lens textures, drag reduction textures, cube corner textures, and combinations thereof.

25. A method of making a product having a textured surface, the method comprising:
    mechanically embossing a macro-scale three-dimensional texture on a web having a surface of a cured polymer provided with a micro- or nanoscale three-dimensional texture.

26. A method comprising:
casting a silicone resin on a textured release web having a macro-scale texture and a micro- or nanoscale texture disposed on the same surface of the web, forming a textured silicone replicative web;
forming a mold comprising the textured silicone replicative web;
utilizing the mold to create a nickel sleeve; and
utilizing the nickel sleeve as a replicative surface to impart the macro-scale texture and micro- or nanoscale texture to a second release web.

27. The method of claim 26 wherein the first texture is selected from the group consisting of diffraction gratings, hydrophobic surface textures, laser interference rainbow patterns, and combinations thereof.

28. The method of claim 26 wherein the first texture is selected from the group consisting of lenticular lens textures, drag reduction textures, cube corner textures, and combinations thereof.

* * * * *